United States Patent [19]

Broyer

[11] 4,390,120
[45] Jun. 28, 1983

[54] SOLDERING METHODS AND APPARATUS

[75] Inventor: Alfred P. Broyer, Hopatcong, N.J.

[73] Assignee: Bell Telephone Laboratories, Incorporated, Murray Hill, N.J.

[21] Appl. No.: 216,372

[22] Filed: Dec. 15, 1980

[51] Int. Cl.³ .......................... H05K 3/34; B23K 1/08
[52] U.S. Cl. ................................ 228/180 R; 228/20; 228/46; 228/222
[58] Field of Search ................. 228/37, 20, 46, 180 R, 228/222; 118/63

[56] References Cited

U.S. PATENT DOCUMENTS

| | | | |
|---|---|---|---|
| 1,756,947 | 5/1930 | Johnston | 118/63 |
| 3,500,536 | 3/1970 | Goldshmied | 228/20 |
| 3,605,244 | 9/1971 | Osborne | 228/180 |
| 3,607,366 | 9/1971 | Kitakyushu | 118/63 |
| 3,874,068 | 4/1975 | Cook | 228/37 |
| 3,998,181 | 12/1976 | Bellen | 118/63 |
| 4,277,518 | 7/1981 | Schillke | 118/63 |

FOREIGN PATENT DOCUMENTS 456746  5/1935  United Kingdom ................. 118/63

Primary Examiner—John Sipos
Assistant Examiner—Marc Hodak
Attorney, Agent, or Firm—J. T. Peoples

[57] ABSTRACT

Apparatus augmenting a wave soldering machine for mitigating warpage of a printed wiring board after it is processed by the soldering machine comprises heat dissipation means (200) and cooling means (202). The dissipation means directs a first gaseous stream over the a narrow, transverse strip on the underside of the board as it exits a crest of molten solder supplied by the soldering machine. The stream solidifies any liquid solder without disturbing the solder joints. The cooling means directs a second gaseous stream to substantially the centerline region of the board as it exits the dissipation means. The seriatim arrangement of heat reduction means produces a cooling characteristic which is the inverse of the temperature characteristic caused by the soldering operation.

6 Claims, 2 Drawing Figures

SOLDERING METHODS AND APPARATUS

BACKGROUND OF THE INVENTION

1. Field of the Invention

This invention relates generally to a wave soldering operation and, more particularly, to apparatus and associated methodology augmenting the soldering operation for mitigating warpage of printed wiring boards.

2. Description of the Prior Art

The introduction of semiconductor technology fostered a need for production line techniques which effected rapid soldering of numerous active and passive components to conductor paths affixed to an insulative panel, that is, to a so-called printed wiring board (PWB). The technique now known as wave soldering has proven to be successful in that the soldering operation rapidly produces solder connections which are electrically reliable as well as mechanically strong and resistant to fatigue.

The conventional wave soldering operation is characterized by moving the PWB, with the components mounted on the top surface and having their electrical leads projecting through to the underside of the PWB, laterally across the crest of a flowing stream of molten solder. As the board exits the stream, a quantity of solder clings to both the electrical leads and the conductor paths and eventually hardens to form a bond between the leads and paths.

A good solder bond is characterized by a fine grain structure and a well filleted layer of solder having a bright finish and making a relatively small angle of contact with the conductor paths on the PWB. A weak solder joint, conversely, is characterized by a coarse grain structure having crystal-like formations. In U.S. Pat. No. 3,605,244, issued to Osborne et al on Sept. 20, 1971, an arrangement is disclosed whereby heat is quickly extracted from the joint, thus preventing formation of excessively crystalline or grainy solder joints. With this arrangement, a cooling medium such as cold pressurized air or other gas is directed against unsoldered portions of the component leads exposed on the top side of the PWB. The board serves as an insulating shield between the cooling medium and solder joint so the solder is not dislodged by the pressurized gas while the component leads serve as heat conductors which dissipate heat from inside the joints to the cooling medium. The joint is thereby chilled in such a manner so as to minimize temperature differentials within the solder as well as accelerating the hardening process.

The Osborne et al disclosure is primarily directed towards apparatus which produces quality solder joints. One difficulty with the wave soldering operation not addressed in this or other prior art is that of producing quality bonds which simultaneously minimizing PWB warpage. During a wave soldering operation, heat is applied to a relatively narrow band of the PWB as it passes over the molten solder. A temperature differential exists in the transverse direction across the PWB as it exits the wave. The temperature characteristic across the narrow band of the board resembles a normal distribution with the centerline region being considerably hotter than the edges. If the temperature across the PWB can be held more constant, warpage may be reduced significantly. This reduction is critical since modern systems require numerous circuit packs or printed wiring boards to be mounted in close proximity in order to achieve high circuit density. Based on conventional wave soldering technology, the warpage requirements established for high density packing are virtually impossible to achieve.

SUMMARY OF THE INVENTION

This as well as other limitations and deficiencies of the prior art are obviated, in accordance with the present invention, by improved wave soldering apparatus and accompanying methodology which induces a substantially uniform temperature across a wiring board as it exits the solder wave.

In the preferred embodiment of the present invention, temperature uniformity is provided by two heat reduction means arranged seriatim at the exit of the solder bath. The first heat dissipation means directs a pressurized gas to a transverse strip on the underside of the wiring board as it exits the solder wave, thereby rapidly solidifying any liquid solder without disturbing the joints. The second cooling means also directs a pressurized gas to the centerline region of the board as it exits the dissipation means.

One feature of the present invention is that the temperature distribution induced by the two-stage heat reduction arrangement is essentially the inverse of that generated by the soldering operation. This inverse compensation effects a substantially uniform temperature distribution.

These and other features and advantages will be better understood from a detailed description of an illustrative embodiment thereof, which follows, when taken in conjunction with the accompanying drawing.

DETAILED DESCRIPTION

For clarity of exposition, it is helpful to first provide an overview of a conventional wave soldering operation and accompanying apparatus. The basic structure presented herein is discussed in detail in Osborne at al. The full disclosure of this reference is incorporated as if it was disclosed in its entirety herein. However, sufficient detail is extracted from the reference to ensure an understanding of the present invention. In addition, although the augmented wave soldering operation of the present invention may be practiced to mitigate warpage of printed wiring boards in other applications and contexts, the description is with reference to the soldering of electrical components to the conductor paths of printed wiring boards.

Figure 1:
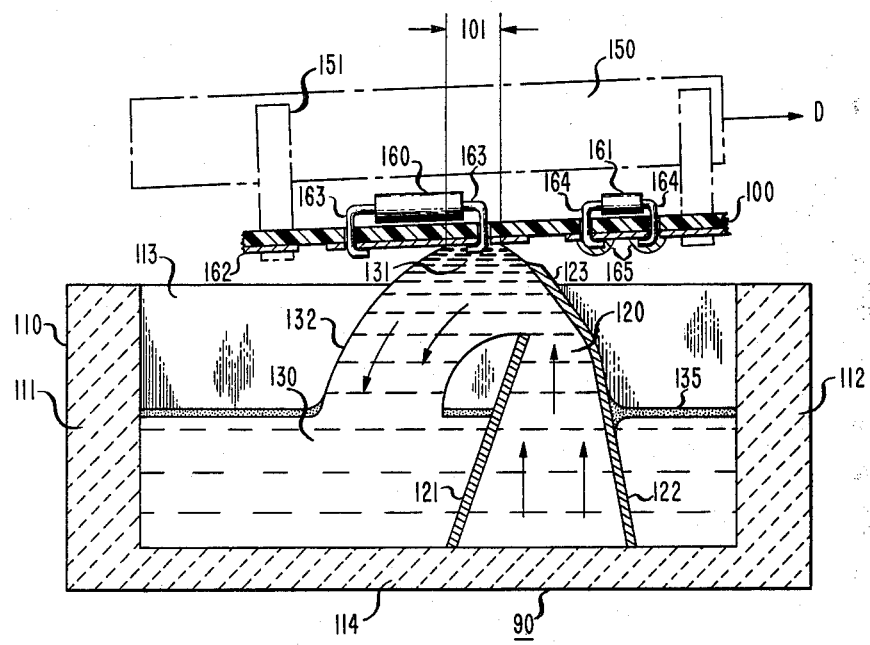
FIG. 1 is a cross-sectional view of conventional wave soldering apparatus depicting a printed wiring board moving through a crest of molten solder.

FIG. 1 illustrates one stage in the operation of a conventional wave soldering machine. The depiction of FIG. 1 represents a cross-sectional view of a portion of wave soldering apparatus 90 which is cut-away along a plane parallel to the direction of motion by board 100 as shown by the arrow labelled D. A narrow strip of board 100, transverse to the direction of motion, is exposed to crest 131 of molten solder 130.

Apparatus 90 includes tank 110 having left wall 111, right wall 112, back wall 113, and bottom 114. Tank 110 is formed from a suitable material capable of withstanding temperatures in excess of the molten solder temperature. Within tank 110 there is located sloping left plate 121 and oppositely-sloping right plate 122 which cooperate at their converging ends to form nozzle 120. Extending from the top of plate 122, at an angle greater than the slope of plate 122, is deflecting member 123. Solder 130 is forced by pump means (not shown) upwardly through nozzle 120 and off deflecting member 123 to form curvilinear stream 132, including crest 131, of molten solder, which then falls into the confines of tank 110. As solder 130 passes through nozzle 120 and is diverted by deflector 123, a shock effect produces ripples or waves (not shown) on the upper surface of crest 131. The waves extend in the direction of flow of curvilinear stream 132.

In order to prevent oxidation on the surface of solder 130 within tank 110, a layer 135 of oil is floated on the surface thereby forming a barrier to air.

Apparatus 90 further comprises conveyor means 150, shown in phantom in FIG. 1, having hook means 151 which resiliently grasp the edges of board 100 for movement thereof across solder crest 131.

Mounted on board 100 are a plurality of electrical components such as resistor 160 and diode 161 having leads 163 and 164, respectively, projecting through holes in board 100. The leads are bent on the underside of board 100 to engage a predetermined pattern of conductor paths depicted as layer 162 in FIG. 1. Leads 163 and 164 are to be soldered to the associated conductor paths as board 100 is advanced by conveyor means 150. As board 100 moves over arcuate stream 131, the underside of board makes contact with the ripples or waves. Because the leads 163 and 164 and the conductor paths have been previously prepared and coated with flux, the solder thoroughly adheres to the leads and corresponding conductor paths. Adhesive forces act to cause a quantity of solder to cling to these conductors thus forming the joints after the portion of the board receiving solder exists stream 131; completed joints are shown with respect to diode 161 as solder bonds 165.

As also depicted in FIG. 1, it is only narrow strip 101 of board 100 that contacts crest 131 at any given instant. Because the edges of board 100 are exposed to a low temperature medium, for instance, the ambient air or hooks 151, heat dissipation is greatest at the edges. Because of the different coefficients of expansion of conductor paths 162 and board material (generally a glass impregnated thermoset plastic) as well as the routing of conductor paths, the location and mass of components and other factors, the temperature differential in transverse strip 101 generally results in a warped PWB upon cooling.

Figure 2:
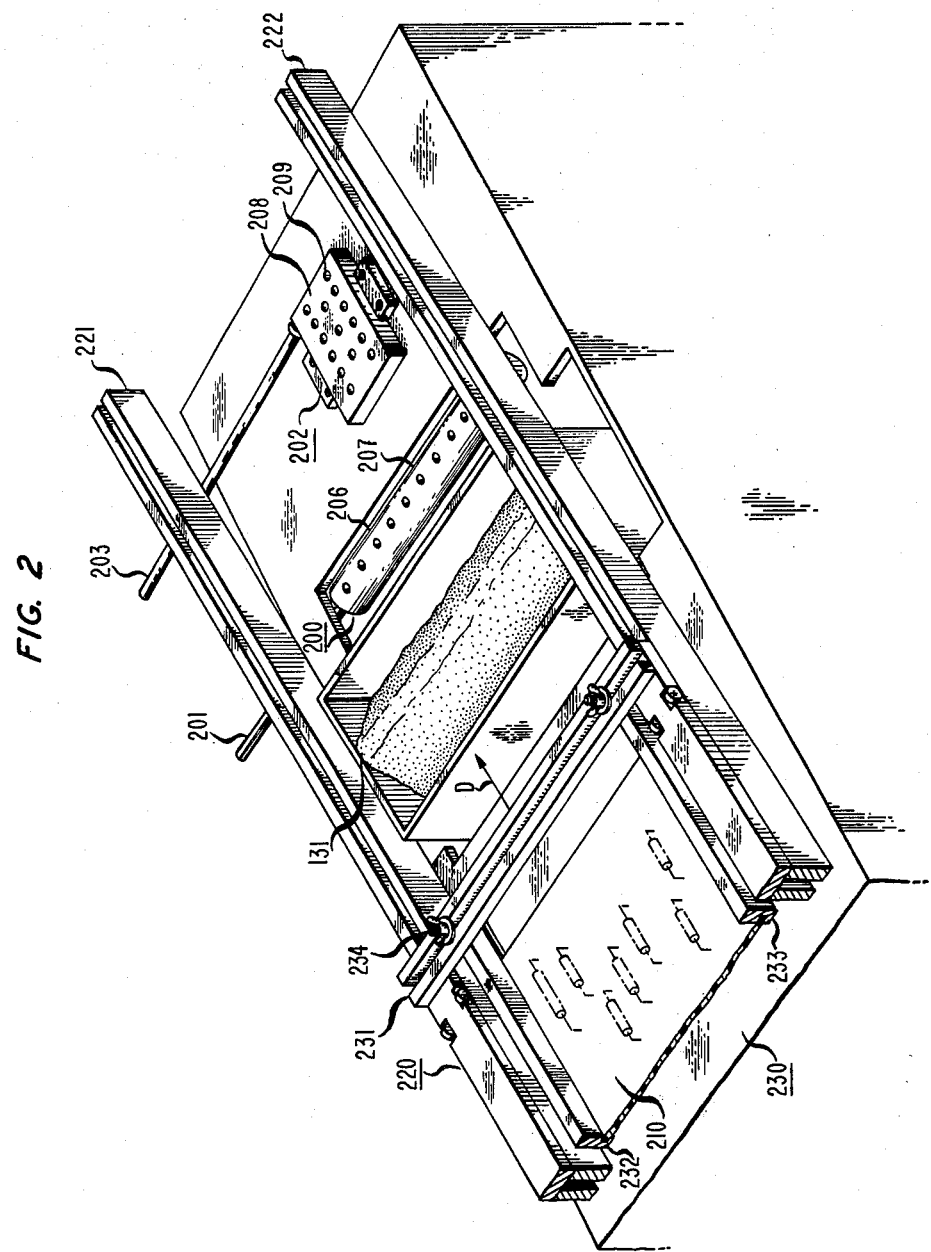
FIG. 2 is a side perspective view of a wave soldering mechanism incorporating apparatus for mitigating warpage in accordance with the present invention.

In FIG. 2, apparatus for mitigating PWB warpage is shown in accordance with the present invention. FIG. 2 depicts, in side perspective view, board 210 prepared for transport through wave solder crest 131 as well as the apparatus, including dissipation means 200 and cooling means 202, utilized to reduce warpage.

Conveyor 220 now comprises fixed, parallel left and right tracks 221 and 222, respectively, and movable rack 230. Rack 230 further comprises: parallel left and right adjustable holders 232 and 233, respectively; cross member 231, which slides along tracks 221 and 222; and fasteners 234 which are affixed to holders 232 and 233 and which slidably engage cross member 231 to adjust holders 232 and 233 in to-and-fro manner to compensate for different board widths. Board 210 is shown in place between holders 232 and 233. In order to minimize heat loss from the edges of board 210, holders 232 and 233 may comprise a low thermal conductivity material such as teflon or transite.

The apparatus which serves to control warpage comprises heat dissipation means 200 and cooling means 202, both of which operate to maintain a temperature distribution across board 201 that is substantially uniform. In the embodiment of FIG. 2, dissipation means 200 further comprises hollow quencher tube 206 having a series of spaced-apart orifices 207 in the top of the tube. Compressed air from a first supply (not shown) enters tube 206 through one end adapted to receive air hose 201. Orifices 207 direct the compressed air to a narrow, transverse strip of board 210 as it exits crest 131 after an exposure interval of about 2 to 5 seconds to solder having a temperature in the range 480°–525° F. so as to rapidly solidify any liquid solder without disturbing the formation of the solder joints. Using air at room temperature, orifice 207 diameter of 0.030 inches and orifice spacing of 0.250 inches, the maximum allowable pressure is about 10.5 pounds per square inch (psi). This pressure may vary depending on, for example, solder bath temperature or ambient temperature conditions.

Cooling means 202 comprises thin, hollow, rectangular manifold 208 having a plurality of spaced-apart holes 209, typically arranged in row and column fashion in the top surface of the manifold. Compressed air from a second supply enters manifold 208 through a side surface adapted to receive air hose 203. Holes 209 direct this second air supply to the centerline region of board 210 as it exits dissipation means 200. For at at room temperature and a hole arrangement of 6 rows and 2 columns, with holes 209 having a diameter of 0.125 inches and being spaced 0.750 inches transversely and 0.875 inches laterally, the maximum recommended pressure is 65 psi. Again, this pressure may vary depending on conditions.

It will be further understood that the warpage control apparatus and associated methodology for mitigating wiring board warping as a result of a wave soldering operation, as described herein, is not limited to the specific forms described by way of illustration, but may assume other embodiments limited only by the scope of the amended claims.

What is claimed is:

1. In combination with means for wave soldering a printed wiring board apparatus
   characterized by
   heat dissipation means (200), including a first pressurized gas, for directing said first gas to a transverse strip on the underside of said board as it exits the solder wave, and
   cooling means (202), including a second pressurized gas, for directing said second gas to a region on said underside only along substantially the centerline of said board as it exits said dissipation means.

2. Apparatus associated with a wave soldering operation on a printed wiring board
   characterized by
   gas supply means (201,203) for delivering a first gas and a second gas,
   heat quencher means (200), disposed transversely to the movement of said board, for directing said first gas to the underside of said board as it exits the solder wave to solidify the solder applied to the joints, and
   cooling means (202) for directing said second gas to said underside only along substantially the centerline of said board as said board exits said quencher means.

3. The apparatus as recited in claim 2 wherein said quencher means comprises a hollow tube (206) having a series of spaced-apart orifices (207) disposed on the top surface of said tube, said tube having one end enclosed and the other end adapted to supply said first gas to the interior of said tube, and said cooling means comprises a hollow, thin rectangular manifold (208) having a plurality of spaced-apart holes (209) on the top surface of said manifold and having one side adapted to supply said second gas to the interior of said manifold.

4. Apparatus as recited in claim 3 wherein said first gas is pressurized air at room temperature with a maximum pressure of about 10 pounds per square inch, and said second gas is pressurized air at room temperature with a pressure substantially above the pressure of said first gas.

5. In combination with a wave soldering operation for applying solder to a printed wiring board, a method characterized by the steps of (i) supplying a first pressurized gas to a substantially transverse strip on the underside of said board as it exits said soldering operation, and (ii) after step (i), directing a second pressurized gas to a region on said underside only along substantially the centerline of said board.

6. A wave soldering machine for applying molten solder to a narrow strip of the underside of a circuit board characterized by a plurality of cooling jets for applying a flow of gases to said underside, said flow having a nonuniform distribution, wherein said subplurality of jets comprises a first subplurality of jets for applying a uniform flow parallel to said strip, whereby said solder is solidified, and a second subplurality of jets for applying a nonuniform flow parallel to said strip having a larger flow at the center of said board than at the edges of said board, whereby warpage of said board is reduced.

* * * * *

UNITED STATES PATENT AND TRADEMARK OFFICE
CERTIFICATE OF CORRECTION

PATENT NO. : 4,390,120

DATED : June 28, 1983

INVENTOR(S) : Alfred P. Broyer

It is certified that error appears in the above-identified patent and that said Letters Patent is hereby corrected as shown below:

Column 4, line 31, "at" first occurrence should read --air--.

Signed and Sealed this

Twenty-fifth Day of October 1983

[SEAL]

Attest:

GERALD J. MOSSINGHOFF

Attesting Officer

Commissioner of Patents and Trademarks